United States Patent
Labatie

(10) Patent No.: US 10,942,205 B2
(45) Date of Patent: Mar. 9, 2021

(54) METHOD AND SYSTEM FOR ANALYZING ELECTRICITY CONSUMPTION

(71) Applicant: SMART IMPULSE, Paris (FR)

(72) Inventor: Antoine Labatie, Paris (FR)

(73) Assignee: Smart Impulse, Paris (FR)

( * ) Notice: Subject to any disclaimer, the term of this patent is extended or adjusted under 35 U.S.C. 154(b) by 0 days.

(21) Appl. No.: 15/911,566

(22) Filed: Mar. 5, 2018

(65) Prior Publication Data
US 2018/0259556 A1 Sep. 13, 2018

Related U.S. Application Data

(63) Continuation-in-part of application No. 14/889,496, filed as application No. PCT/FR2014/051062 on May 6, 2014, now abandoned.

(51) Int. Cl.
*G01R 21/133* (2006.01)
(52) U.S. Cl.
CPC .................. *G01R 21/133* (2013.01)
(58) Field of Classification Search
CPC .................................................. G01R 21/133
See application file for complete search history.

(56) References Cited

U.S. PATENT DOCUMENTS

| | | | |
|---|---|---|---|
| 8,554,501 B2 * | 10/2013 | Diop | G01R 21/133 702/61 |
| 9,470,551 B2 | 10/2016 | Ramakrishnan et al. | |

(Continued)

FOREIGN PATENT DOCUMENTS

| | | |
|---|---|---|
| EP | 1296147 A1 | 3/2003 |
| EP | 2000780 A1 | 12/2008 |

(Continued)

OTHER PUBLICATIONS

Chang et al. A New Measuremnet Method for Power Signatures of Nonintrusive Demand Monitoring and Load Identification. IEEE, vol. 48, No. 2, Mar./Apr. 2012 (Year: 2012).*

(Continued)

*Primary Examiner* — Raymond L Nimox
(74) *Attorney, Agent, or Firm* — Harness, Dickey & Pierce, PLC

(57) ABSTRACT

A system for analyzing electrical consumption of a site equipped with a plurality electrical equipment. The system comprises at least one sensor for periodic measurement of global consumption of the site by measuring current and voltage signals on at least one of the electrical phases upstream of the supply network for the site. The system comprises a processor for decomposing the global consumption of the site to individual consumption of each kind of electrical equipment based on a set of signatures with each signature has power load coefficients representing power loads of the corresponding electrical equipment. The system comprises a processor for optimizing the set of signatures and power load coefficients in comparing a calculated recomposition of the individual consumption with the measured global consumption to have a smallest difference of the comparison result, while respecting physical constraints of the set of signatures and the power load coefficients.

11 Claims, 9 Drawing Sheets

(56) References Cited

U.S. PATENT DOCUMENTS

| | | | |
|---|---|---|---|
| 2010/0191487 A1* | 7/2010 | Rada | G05F 1/70 702/60 |
| 2010/0280978 A1* | 11/2010 | Shimada | H02J 13/0079 706/12 |
| 2011/0153246 A1* | 6/2011 | Donaldson | G01R 21/1331 702/65 |
| 2011/0191041 A1 | 8/2011 | Diop et al. | |
| 2011/0251807 A1* | 10/2011 | Rada | G01D 4/00 702/61 |
| 2012/0004871 A1* | 1/2012 | Tsao | G01R 19/2513 702/61 |
| 2012/0059607 A1 | 3/2012 | Rebec et al. | |
| 2012/0072389 A1* | 3/2012 | Aldridge | G06N 5/04 706/54 |
| 2012/0197560 A1* | 8/2012 | Kuhns | G01R 19/2513 702/60 |
| 2012/0278014 A1* | 11/2012 | Davies | G01D 4/00 702/61 |
| 2012/0290230 A1* | 11/2012 | Berges Gonzalez | G01D 4/004 702/61 |
| 2013/0066479 A1* | 3/2013 | Shetty | G01D 4/002 700/295 |
| 2013/0138661 A1* | 5/2013 | Lu | H02J 13/00 707/748 |
| 2013/0158908 A1* | 6/2013 | Ramakrishnan | G01D 4/002 702/60 |
| 2015/0137990 A1* | 5/2015 | Riche | G01D 4/00 340/870.03 |

FOREIGN PATENT DOCUMENTS

| | | | | |
|---|---|---|---|---|
| EP | 2402771 A2 | 1/2012 | | |
| GB | 2471536 A * | 1/2011 | | G06Q 50/06 |
| GB | 2471536 A | 1/2011 | | |
| GB | 2475172 A | 5/2011 | | |
| WO | 2010106253 A2 | 9/2010 | | |
| WO | 2011012840 A2 | 2/2011 | | |
| WO | 2012103138 A1 | 8/2012 | | |
| WO | WO-2012103138 A1 * | 8/2012 | | G07C 3/00 |
| WO | 2012168629 A1 | 12/2012 | | |

OTHER PUBLICATIONS

Hsueh-Hsien Chang et al.; A New Measurement Method for Power Signatures of Nonintrusive Demand Monitoring and Load Identification; IEEE Transactions on Industry Applications, IEEE Service Center, Piscataway, NJ, US; vol. 48, No. 2, Mar. 1, 2012; pp. 764-771, XP011434193, ISSN: 0093-9994, DOI: 10.1109/TIA.2011.2180497.

International Search Report for PCT/FR2014/051062 dated Jul. 24, 2014.

\* cited by examiner

METHOD AND SYSTEM FOR ANALYZING ELECTRICITY CONSUMPTION

CROSS-REFERENCE TO RELATED APPLICATIONS

This application is a Continuation-In-Part of U.S. patent application Ser. No. 14/889,496, filed Nov. 6, 2015, which is a 371 of International Application No. PCT/FR2014/051062, filed May 6, 2014, which claims priority of FR 1354125, filed May 6, 2013, which are also incorporated herein by reference.

BACKGROUND

The present invention relates to the field of the analysis of the electrical consumption of a residential, tertiary or industrial site that is non-intrusive, that is to say does not require the installation of sensors associated with each of the items of equipment to be monitored. This analysis makes it possible in particular to identify the main energy-saving levers.

In the prior art various solutions are known consisting of acquiring information on the form factors of the supply current and/or voltage upstream of the site and deducing information on the individual consumption of each of the items of electrical equipment.

A first family of solutions consists of observing the variations over time in the load curve and identifying signatures compared with reference signatures recorded for the main items of equipment.

In particular, the European patent application EP 2000780 describes a method for detecting and estimating the consumption of the electrical usage of installations of a subscriber, characterised in that it consists at least of:
  establishing the general electrical consumption curve of the installations of the subscriber, the step consisting of establishing the general consumption curve of the installations of the subscriber including at least: sampling the consumption of the flows consumed by the installations of the subscriber, said sampling occurring downstream of the flow consumption meter connected to the connection to the general network;
  by segmenting the general consumption curve of the installations of the subscriber and by monitoring the electrical consumption events in transient state, recognising the electrical usage and estimating their corresponding consumption.

The international patent application WO 2010/106253 is also known, describing a method for analyzing the electrical consumption of a plurality of electrical appliances functioning on a consumption site, by filtering a load curve representing the electrical consumption of said appliances as a function of time, characterised in that it comprises the following steps:
  prior to the filtering proper of said load curve:
  recording and digitising the load curve, so as to obtain a load curve digitised by time periods;
  defining a set of classes of appliances, each class being defined by similar power variation cycles;
  defining, for each class of appliance, a filtering algorithm for the load curve dedicated to said class of appliance, said algorithm being able to extract power variation cycles of the digitised load curve, and to allocate it to said class of appliance;
  then, during the filtering proper of the digitised load curve, successively using the filtering algorithms dedicated to each class of appliance, in order to identify and group together, from the digitised load curve, the variation cycles of the power consumed by the electrical appliances.

A second family of solutions consists of taking into account not the variation over time in the power measured upstream of the installation, but taking into account the waveform of the current consumed by each item of equipment.

In particular, international patent application WO 2011/012840 relates to a method for identifying the functioning of an electrical appliance, for example an induction motor. The method comprises the identification of the functioning of an electrical appliance when a path traced by real power values with respect to corresponding virtual power values over a particular period comprises one or more substantially circular arcs. The real power values are associated with the total real power supplied to one or more electrical appliances as a function of time, and the virtual power values are associated with the total virtual power supplied to one or more electrical appliances as a function of time. The invention also relates to an associated method for identifying the functioning of a specified type of appliance, in which the functioning of said specified type of appliance depends on the supply of at least one energy source, such as electricity, natural gas or water. The invention also concerns computer programs, media that can be read by computer and corresponding computer program products and apparatus.

In the same family of solutions, the European patent EP 1296147 describes a method for estimating the individual electricity consumption of a plurality of electrical appliances, consisting of:
  creating a model for estimating the electricity consumption of each of the electrical appliances from relationships between the data concerning fundamental and high harmonics of full-load current and their voltage phase differences from the full-load current and the voltage obtained from combinations of various states of use of a plurality of electrical appliances and the electrical consumption used for obtaining said data
  and obtaining the electricity consumption of individual appliances in operation using said model for estimating the consumption of each appliance from said fundamental and high harmonics of said full-load current and their said voltage phase differences obtained from said full-load current and voltage measured in a vicinity of a service entry.

The international patent application WO 2012/168629 of the applicant is also known, describing the invention of a method for analyzing the electricity consumption of a site equipped with a plurality of items of electrical equipment of different natures, consisting of:
  periodically measuring the current and voltage on at least one of the electrical phases upstream of the supply network of the site
  applying to a combination of the digitised signals a processing for determining the distribution of the consumption according to at least some of said items of equipment according to a signature of each of said items of equipment, characterised in that said processing consists of comparing the current waveform measured with a library of signatures previously recorded for each of said items of electrical equipment, said signatures comprising at least one parameter that is a function of the waveform of the supply voltage
  determining and recording the signature of each of the items of equipment during a prior step consisting of applying to each of the items of equipment a predetermined series of supply sequences with voltage signals the waveform of which is representative of waveforms observed on common electrical installations.

DRAWBACKS OF THE PRIOR ART

The methods consisting of observing the variations over time in the load curve and identifying signatures compared with reference signatures recorded for the main items of equipment are not suitable for analyzing sites comprising a large number of items of equipment. This is because the periodicity of the acquisitions is around one second. When several items of equipment stop or start with a short offset in time, less than the acquisition periodicity, a phenomenon of masking occurs that prevents relevant recognition of the items of equipment in question.

Moreover, the method takes into account only transients (switching on/off) and does not make it possible to take into account equipment that is functioning continuously.

These problems have led to developing the second family of solutions, based on analysis of waveforms.

The technical problem posed by these methods is that of the robustness of the processing operations. This is because these methods are based on the characterisation of an item of equipment by a signature recorded in a particular situation. When the equipment is used on a site, this signature is slightly disturbed, in particular by the quality of the supply voltage. It is therefore necessary to provide a margin of error to allow effective detection of the equipment. This margin of error nevertheless leads to a risk of confusion between items of equipment that are separate but each characterised by similar signatures.

To reduce this risk, the methods known in the prior art require a tedious local parameterising step, which can be carried out only by a human operator present on the site for a relatively long time. This local parameterising step consists of generating each of the signatures by proceeding with a measurement of current and voltage on the electrical supply to the equipment, when it is in operation.

Finally, the patent EP 2402771 is known, describing a power-monitoring device for identifying the state of an electrical appliance on the basis of user assessments and a method for monitoring the power thereof is provided.

The power-monitoring device comprises a measuring module, a variation detection and the search module, and a signature database for the electrical appliance established on the basis of the evaluations of the users.

When the measurement module detects a variation in a power consumption characteristic, the detection of variation and the module searching for the signature of the electrical apparatus in the database as a function of the variation to obtain electrical appliances similar to the variation and the states thereof.

A user supplies data to the signature database of the electrical apparatus, by confirming the search result, or by selecting the correct electrical appliance and the state thereof.

When the user confirms the search result, the power monitoring device establishes an association between the electrical appliance and the signatures of the electrical appliance and updates the database with the signature of the electrical appliance.

In particular, the patent EP 2402771 proposes using the signature common to all the users, and does not take into account the context of the premises and the disturbances caused by the network.

SUMMARY

To this end, the invention relates, in its most general sense, to a method for analyzing the electricity consumption of a site equipped with a plurality of items of electrical equipment of different kinds, consisting of periodically measuring the current and voltage on at least one of the electrical phases upstream of the electrical network of the site, consisting of:
  sampling at least the current signal at a frequency at least thirty times greater than the fundamental frequency of the electrical supply voltage
  applying a Fourier transform to each fundamental period of the current signal at least
  proceeding with a temporal smoothing of said transformed signal by calculating a temporal mean over a characteristic period of change in behaviour of the equipment in the network (a period that is sufficiently long compared with the carrier period; sufficiently short not to cover several events);
  forming a database of signatures suited to the site being studied during a first implementation step, consisting of:
    recording, during a long period, candidate signatures liable to be associated with a variation in consumption of one of said items of equipment
    optionally adding prequalified signatures to said database
    iteratively changing the parameters of the non-prequalified signatures
    recording in a reference database the signatures that are most representative of the events related to the functioning of said equipment
    optionally qualifying each of the signatures recorded in said database with respect to an associated event
  next using said database of reference signatures for qualifying the events occurring on said network.

This solution avoids the action of an operator on site through an auto-configuration of the system in order to form in an automated manner a signature database perfectly in accordance with the events that it is wished to detect.

The present invention aims to afford a technical solution to the problems posed by the analysis methods of the prior art.

To this end, the invention relates, in its most general sense, to a method for analyzing the electricity consumption of a site equipped with a plurality of items of electrical equipment of different kinds, consisting of periodically measuring the current and voltage on at least one of the electrical phases upstream of the supply network of the site, applying a processing to a combination of the digitised signals in order to determine the distribution of the consumption according to at least some of said items of equipment, characterised in that said processing consists of comparing the current waveform measured with a catalogue of signatures corresponding to the electrical components present on the site in question, at least some of which consist of signatures extracted during a configuration step using a history of current waveform data recorded on the site, and others of which may come from a library of signatures recorded in advance, said signatures and the associated temporal consumption curves being finally allocated to the electrical equipment on the site.

Preferably, after the extraction of new signatures at the configuration step, these signatures are enabled to vary slightly in order to allow decomposition of the current waveforms measured as a linear combination of the disturbed extracted signatures and the fixed signatures that were recorded in advance, with, for each signature, associated consumptions that are positive. The disturbances of the extracted signals make it possible in particular to take into account the variability of the real signatures due to the variations in the supply voltage waveform, as well as the intrinsic variability of the real signatures.

Preferably, the signature of at least some of said items of equipment is a function of a combination of signatures of the electrical components used by the equipment in question.

Advantageously a processing is also carried out taking into account the activation cycle of the electrical components constituting each of the items of equipment in question.

Preferably, at least some of the signatures comprise at least a parameter that is a function of the waveform of the supply voltage observed.

According to a particular embodiment, a catalogue of signatures is associated with at least some of the items of equipment, each of the signatures of said catalogue of an item of equipment in question taking into account the voltage waveform of the supply signal measured at the time of acquisition of the signature.

According to a preferred embodiment, the analysis processing consists of applying a first step of calculating a fast Fourier transform on the current and voltage signals.

Advantageously, the analysis processing consists of applying a second step of decomposition of the result of the fast Fourier transform according to the characteristic signatures of each of said items of equipment.

According to a variant, the analysis processing consists of applying an additional step of validation of the results of the decomposition step consisting of verifying the presence of temporal variations in the current waveforms of each of the components recognised. Preferably, the analysis processing comprises an additional step of associating recognised components in order to identify the items of equipment concerned.

The invention also relates to the method for extracting new signatures of electrical equipment present on a given site, from a history of current waveform data measured on said site.

Preferably, these signatures are extracted by means of a mathematical optimisation algorithm aimed at minimising the objective function that depends on said signatures on a history of current waveform data measured on the site in question. At each iteration of the optimisation, and the current waveforms are decomposed as linear combinations of the signatures estimated at this moment of the optimisation, by multiplying the signature of the current waveform by the pseudo-inverse matrix of the matrix constructed by aggregation of the estimated signatures. The coefficients of these linear combinations supply the temporal real power consumption curves associated with these signatures on the data history. The objective function is calculated directly from these real power curves. The algorithm updates the estimation of the signatures at each iteration for the purpose of minimising the objective function.

Advantageously, the objective function calculated with the real power curves associated with each signature consists of a sum of three sub-functions. A first sub-function penalises the negativity of the consumption curves for each signature. A second sub-function penalises the correlation between the derivatives of the consumption curves of the various signatures, that is to say penalises the power variations correlated with the various signatures. Finally, the third sub-function favours the non-Gaussianess of the derivatives of the real power curves of the various signatures, using the same principle as the analysis methods in independent components.

In a particular embodiment, some signatures may be fixed throughout the optimisation process so that the optimisation relates only to the part of the catalogue of signatures apart from said fixed signatures. These signatures may be signatures of generic appliances, such as for example signatures of purely resistive appliances. Advantageously, these generic signatures were recorded previously with a parameter dependent on the waveform of the supply voltage, this same parameterisation being used at each iteration of the optimisation, in order to incorporate the signatures in the catalogue of signatures according to the waveform of the supply voltage at each instant in the history, and to obtain the real power decomposition of the various signatures. The fixed signatures in the catalogue may also be signatures of electrical appliances specific to the site being studied and measured on said site.

According to a variant, the method further comprises a supplementary processing step of decomposition of each signature extracted from a database of known signatures in order to determine whether or not it is unitary.

The invention also concerns a method for constructing a library of signatures and for modelling the equipment with a view to implementing the aforementioned analysis method, characterised in that the various electrical components forming said equipment are supplied with a reference waveform voltage, and for recording digital data representing the waveform of the voltage and current signals measured.

Preferably, for each item of equipment, a catalogue of signatures is recorded, each corresponding to the waveform of the voltage and current signals measured during the supply with a voltage with a different waveform.

In accordance with the present disclosure, there is provided a system for analyzing electrical consumption of a site equipped with a plurality electrical equipment: the system comprising at least one sensor for a periodic measurement of a global consumption of the site by measuring current and voltage signals on at least one of the electrical phases upstream of the supply network for the site; the system comprising at least one processor for decomposing the global consumption of the site to individual consumption of each kind of electrical equipment based on a set of signatures with each signature having power load coefficients representing power loads of the corresponding electrical equipment; for optimizing the set of signatures and power load coefficients in comparing a calculated recomposition of the individual consumptions with the measured global consumption to have a smallest difference of the comparison result, while respecting physical constraints of the set of signatures and the power load coefficients.

In another and alternative embodiment, the power load coefficients are positive.

In another and alternative embodiment, the first order harmonic of the signature is dominant in the energy weight after Fourier transformation.

In another and alternative embodiment, the power load coefficient evolves with a minimization of variation.

In another and alternative embodiment, a same set of signatures can be shared by different electrical phases of a site.

BRIEF DESCRIPTION OF THE DRAWINGS

The present invention will be understood more clearly from a reading of the following description of a non-limitative example embodiment, referring to the accompanying drawings, where.

DETAILED DESCRIPTION

Figure 1:
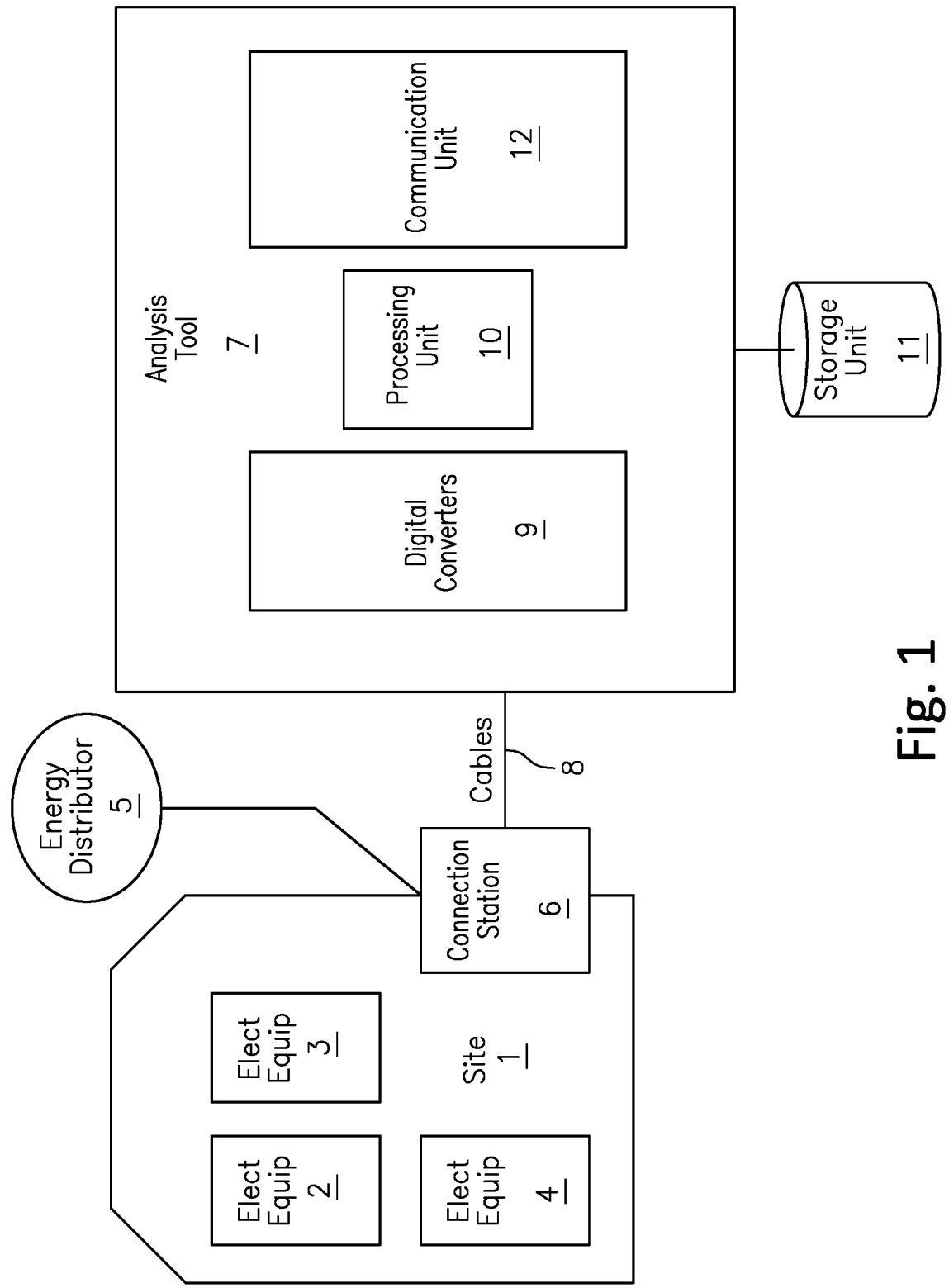
FIG. 1 depicts a schematic view of an installation equipped with an analysis means according to the invention

FIG. 1 depicts an example embodiment of the invention.

The site (1) consists for example of an individual or collective dwelling building, office premises or an industrial building, or a park containing several buildings.

In this building, various items of electrical equipment (2 to 4) are installed, for example a computer, a lamp, an item of domestic electrical equipment, heating or air-condition equipment, etc.

These various items of equipment are connected to a private electrical network, the architecture of which is conventional, this private network itself being connected to the electrical network of an energy distributor (5) by means of a connection station (6), for example a low-voltage general panel associated with a delivery station.

Voltage and current sensors are installed in this connection station.

On each of the supply phases, Rogowski loops are installed, which supply a signal that is a function of the current with great precision.

For measuring the voltages, a cable connected to the analysis tool (7) is connected to each of the phases. The analysis tool (7) is connected to the connection station (6) by a cluster of cables (8) for transmitting the waveforms of the currents and voltages being measured.

Measurement of the Voltage

On a single-phase network (one neutral conductor and one phase) or a three-phase network (three phases and optionally a neutral), the voltage is the electrical quantity supplied by the energy distributor on each phase. Each electrical appliance connected to a socket is subjected thereto.

In order to know the electrical environment of the network being observed, we will measure the waveform of the voltage on each of the phases. This is because the behaviour of an electrical appliance may vary according to the voltage to which it is subjected.

The information of interest is the waveform of the voltage during a period of the signal (20 ms at 50 Hz for example), referred to as the "observation period". This waveform of the voltage, which can be assimilated to a sinusoidal wave that has undergone disturbances throughout the network connecting the power station to the consumption station, is routed to an electronic card and then acquired by an analogue to digital converter. It is thus represented in digital form. The number of samples per period and the depth of digitisation must be sufficiently great to allow faithful restoration and low measurement noise. Experience shows the need for at least 64 points per period and a digitisation depth of a minimum of 10 bits.

Measurement of the Intensity of the Current

Each appliance connected to an electrical network is subjected to a voltage and consequently consumes a current. On a single-phase network, this current passes through the neutral and the phase; on a balanced three-phase network, the current passes through the phases; on an unbalanced three-phase network, the current passes through the three phases and the neutral.

Starting from the finding that the components forming an electrical appliance have an influence on the disturbances imparted to the current passing through it, we wish to measure the intensity of this current precisely.

To do this, we employ current sensors (one per phase), the role of which is to generate a signal that is an image of the current passing through an electrical conductor. More precisely, we use these non-intrusive sensors, referred to as Rogowski loops, which are in the form of rings to be placed around supply cables of an electrical installation. Since these rings are open, it is not necessary to cut off the current to fit them.

The information of interest is the waveform of the intensity of the current during a period of the signal (20 ms at 50 Hz for example), referred to as the "observation period". This waveform of the voltage, which can be assimilated to a sinusoidal wave that has undergone disturbances throughout the network connecting the power station to the consumption station, is routed to an electronic card and then acquired by an analogue to digital converter. It is thus represented in digital form. The number of samples per period and the depth of digitisation must be sufficiently great to allow faithful restoration and low measurement noise. Experience shows the need for at least 64 points per period and a digitisation depth of a minimum of 10 bits.

Presentation of the Analysis Tool

The method for analyzing and distributing the consumption of electricity requires an efficient chain for the measurement and acquisition of the waveforms of the voltages and currents. The device (7) on which these steps are based is composed of the following modules.

The current and voltage waveform signals measured at the connection point (6) and routed by the cluster of cables (8) are digitised simultaneously by high-precision low-noise analogue to digital converters (9).

The processing unit (10) performs digital operations on the measured data and compares with them with references stored in a storage unit (11) in accordance with the method described below.

The results thus obtained are made available to third-party appliances or operators by means of a communication unit (12).

Presentation of the Construction of a Signature Library

In order to guarantee robustness of the algorithms used, we model a plurality of electrical appliances before any analysis. The purpose of this phase is to construct a signature library corresponding to certain appliances to be identified once on site.

Figure 2:
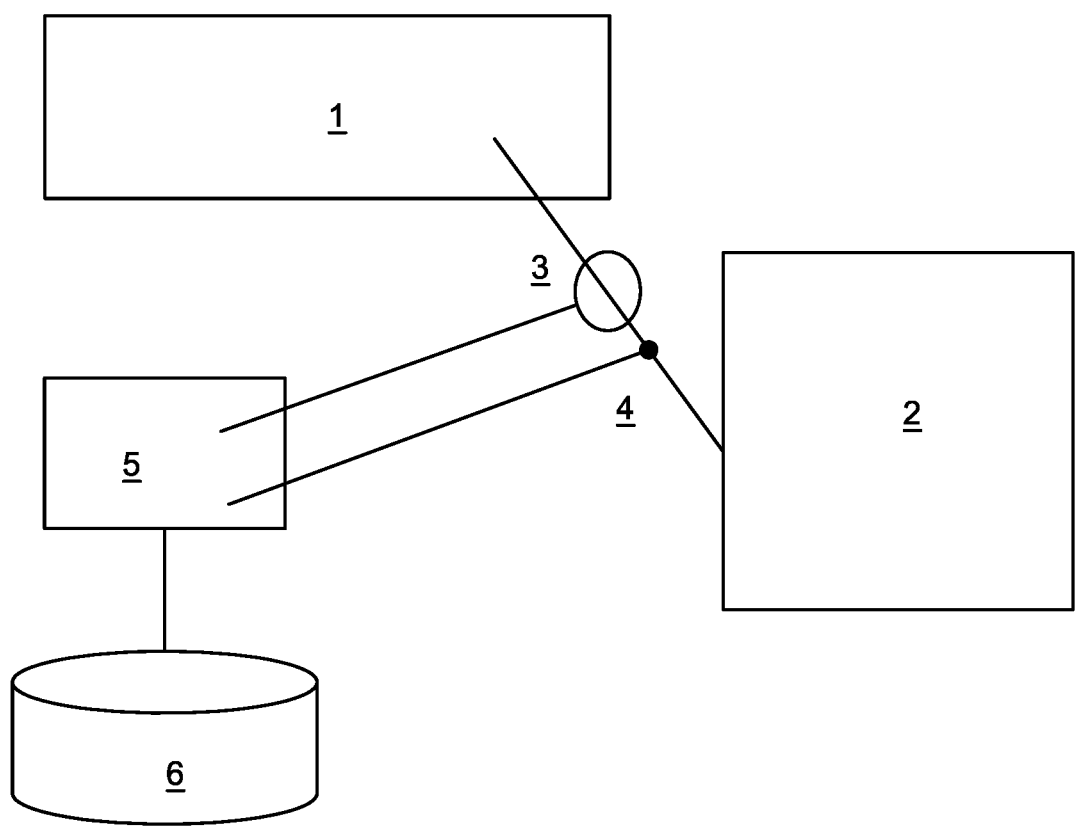
FIG. 2 shows the diagram of the steps implemented by the method

FIG. 2 depicts a schematic view of the modelling method. An electrical appliance (2) is modelled by a series of current waveforms captured while the appliance is being supplied by a series of different voltage waveforms.

If possible, the electrical appliance to be modelled (2) is subjected to a series of voltage waveforms generated by a programmable voltage source (1) in accordance with a statistical distribution of the voltage waveforms normally encountered on the site in question or in absolute terms. For each of these voltage waveforms, a measurement is made, by means of an acquisition unit (5) and current (3) and voltage (4) sensors, the waveforms of the supply voltage and of the current consumed by the electrical appliance. The pair of waveforms is stored in the catalogue (6).

If the appliance cannot be supplied by a programmable voltage source—for reasons of space requirements or excessively high power—measurements are made on site over a sufficiently long time to observe sufficiently different voltages waveforms.

By default, if only one current waveform associated with a single voltage waveform is available, the results are extrapolated in order to propagate the voltage variations to the current waveform.

A signature library is obtained by aggregating the various voltage and current waveform measurements for each appliance modelled.

Figure 3:
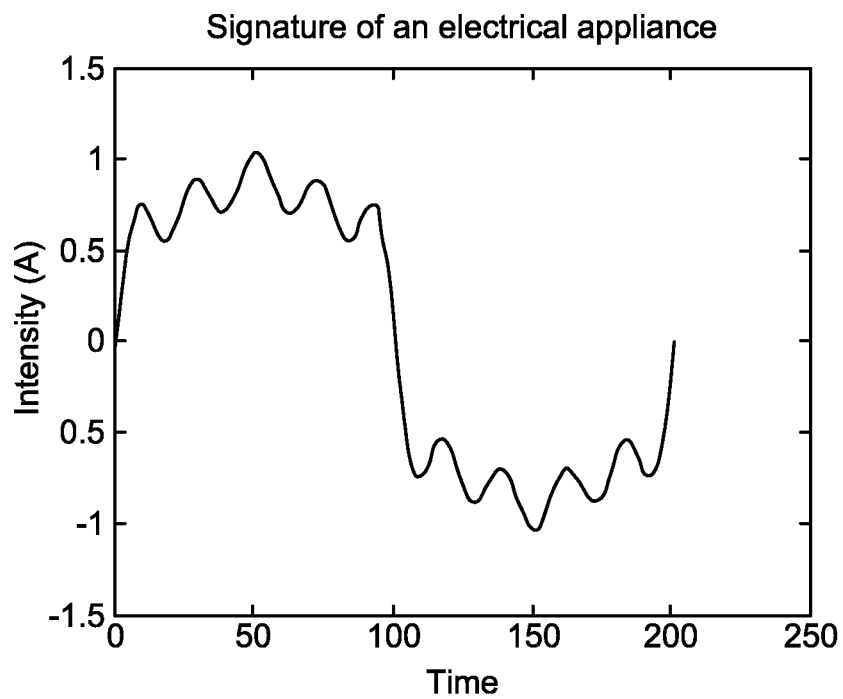
FIGS. 3 and 4 depict, for a fixed voltage waveform, respectively the current waveform of an electrical appliance, and the histogram of the harmonics resulting from the application of a fast Fourier transform to the current signal
Figure 4:
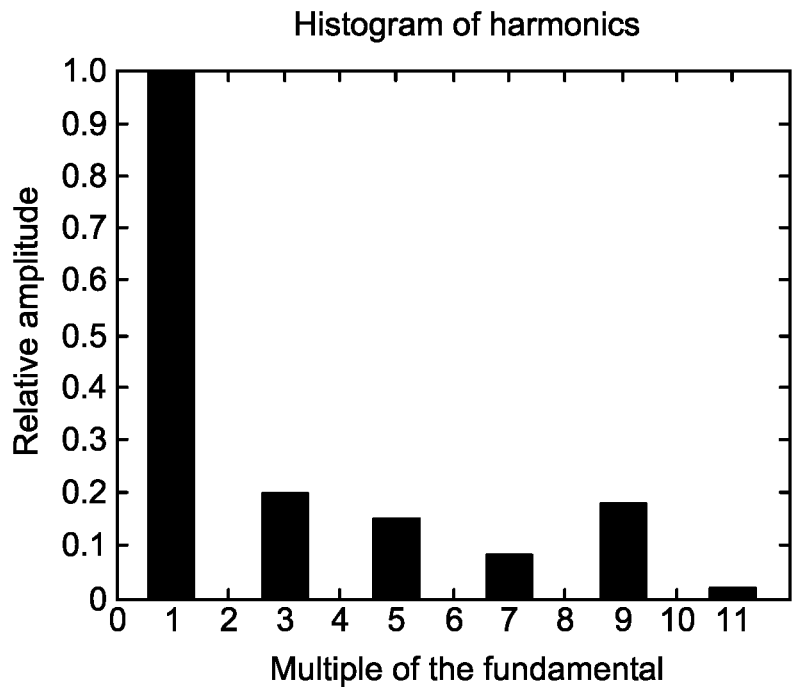

FIGS. 3 and 4 depict, for a fixed voltage waveform, respectively the current waveform of an electrical appliance and the histogram of the harmonics resulting from the application of a fast Fourier transform to the current signal illustrated by FIG. 4.

The signature consists by way of example of the following parameters for a fixed voltage waveform:
  the real part of the successive harmonics of the current signals
  the imaginary part of the successive harmonics of the current signals.

These parameters make it possible to take into account the frequency and time characteristics of the current.

These parameters are both stable and reproducible, and differentiate the electrical elements constituting the equipment.

Presentation of the Signal Processing Operations

The method for distributing the consumption of electricity is based on an analysis of the current and voltage waveforms. It is broken down into five phases: pre-processing of the signals, selection of a series of suitable signals fixed in the signature matrix, extraction of new signatures by means of an optimisation algorithm during a configuration step, decomposition of the signals observed according to all these signatures by means of a second optimisation algorithm, and allocation of the time curves of consumption of the various signatures to the equipment present on the site.

Presentation of the Configuration Algorithm

Figure 5:
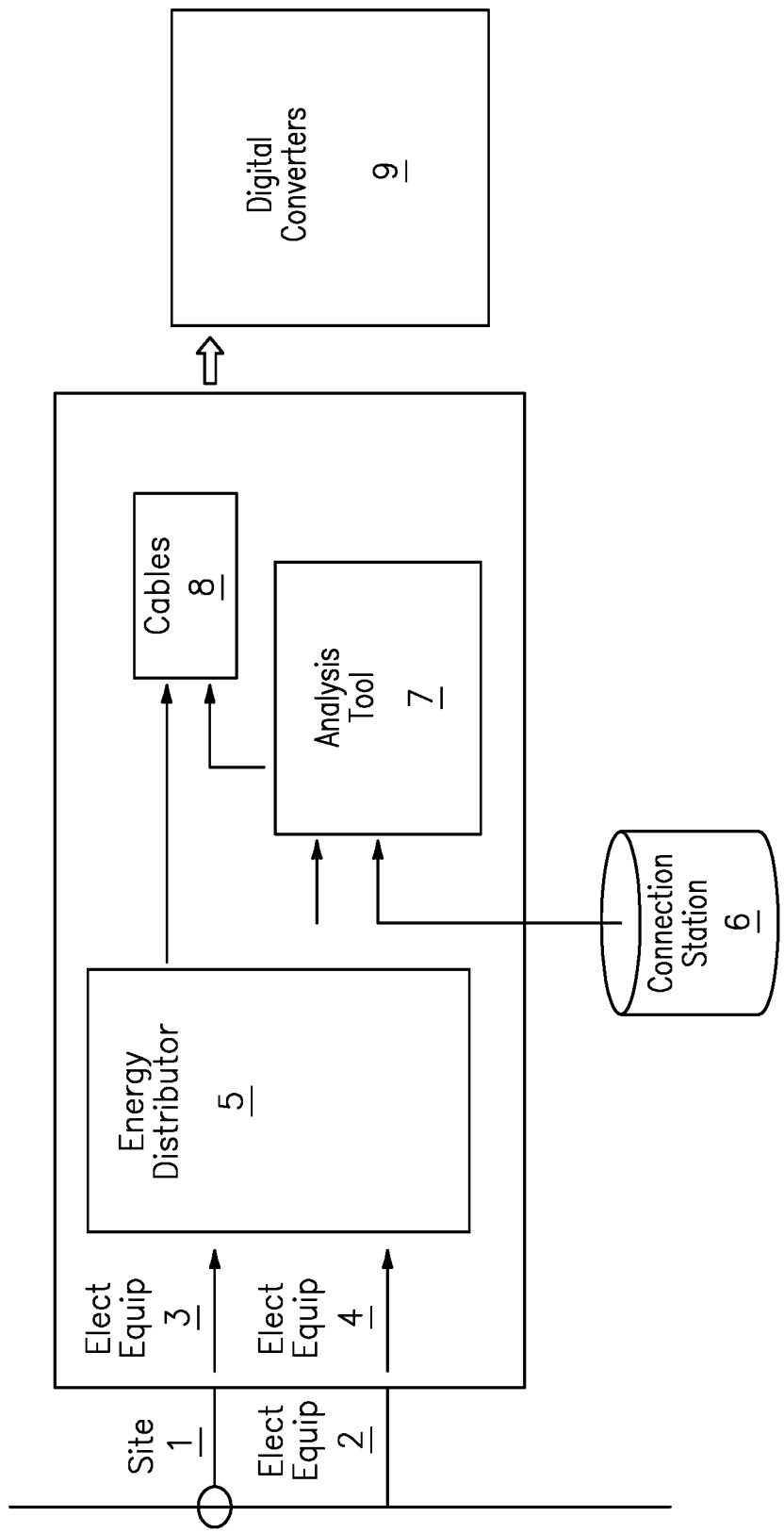
FIG. 5 depicts a schematic view of the processing operations applied to the current and voltage signals measured at the input of the supply network of the site

FIG. 5 depicts a schematic view of the processing operations applied to the current and voltage signals measured at the input to the supply network of the site or part of the site (1, 2), as far as the step of extraction of new signatures.

First of all, because of the number of transients and artefacts that may occur on a large electrical network, a de-noising step must be implemented (3, 4). It is a case of measuring all the physical quantities, voltages and intensities, over a large number of periods.

In a particular embodiment the measurements that have the fewest fluctuations are isolated and the average is calculated. We proceed thus: simultaneous measurement of the current and voltage waveforms; calculation of the variations in the successive waveforms; selection of the most similar periods; calculation of the average waveforms.

Then the de-noised voltage and current signals are converted in the frequency space by applying a fast Fourier transform (FFT) (3, 4). Experience shows that it is often sufficient to consider only the odd harmonics.

A selection of electrical appliances from a library of appliances previously modelled (6) is then made, corresponding to electrical appliances present on the site (7).

When this selection and a sufficiently long history of de-noised current and voltage FFT data (5) are available, a configuration step is performed.

This configuration step (8) consists of an algorithm for extracting the signatures of electrical appliances present on the site being studied and not included in the initial selection of modelled appliances. A complete catalogue of signatures suited to the site being studied (9) is then available at the output of the algorithm.

In mathematical terms, a current FFT vector measured on the site at a given instant in the history can be obtained by multiplication of a vector consisting of the consumptions associated with the various signatures of appliances present on the site by means of the matrix, the various columns of which are given by said signatures, with a convention of normalisation of these signatures so that they each represent a unit consumption, and also assuming that the various signatures are linearly independent.

A simple example of signatures that are not linearly independent is given by a set of more than two purely sinusoidal signatures, characteristic in particular of purely resistive and inductive equipment. Under these circumstances, it is possible simply to find the consumption associated with each signature by multiplying the current FFT vector measured on the site by the pseudo-inverse matrix of the matrix of signatures.

The algorithm aims to minimise an objective function that depends on the matrix of signatures. In this matrix the signatures of previously modelled appliances that have been selected are fixed. The electrical signature of an appliance being dependent on the waveform of the voltage that supplies it, we make, for each instant of the history, a selection of the signatures that correspond closest to the situation encountered. During optimisation, the only variables left free in the matrix of signatures are therefore the complementary signatures, referred to as the extracted signatures, which are not taken into account in the fixed signatures, and which do not have any dependency in the voltage waveform in the optimisation procedure.

For a given matrix of signatures, the algorithm calculates the consumptions associated with each instant of the history by the pseudo-inverse method described above. The algorithm can then calculate the objective function that depends directly on these consumption curves. The objective function is given by the sum of three sub-functions, aimed at favouring or penalising certain consumption behaviours. The first sub-function penalises the negative consumption values. The second and third sub-functions are applied to the time derivatives of the consumption currents. The second sub-function penalises the temporal correlation between the temporal derivatives of the consumption curves of different signatures. Finally, the third sub-function favours the non-Gaussianess of the temporal derivatives of the consumption curves, using the same principle as the algorithms for analysis in independent components.

Since this minimisation is difficult because of possible local minima, an initialisation with an independent component analysis algorithm is advantageously carried out on the temporal derivatives of the FFT vectors of the current measurements. This extremely rapid initialisation makes it possible initially to optimise the two sub-functions that are applied to the derivatives of the temporal consumption curves.

Figure 7:
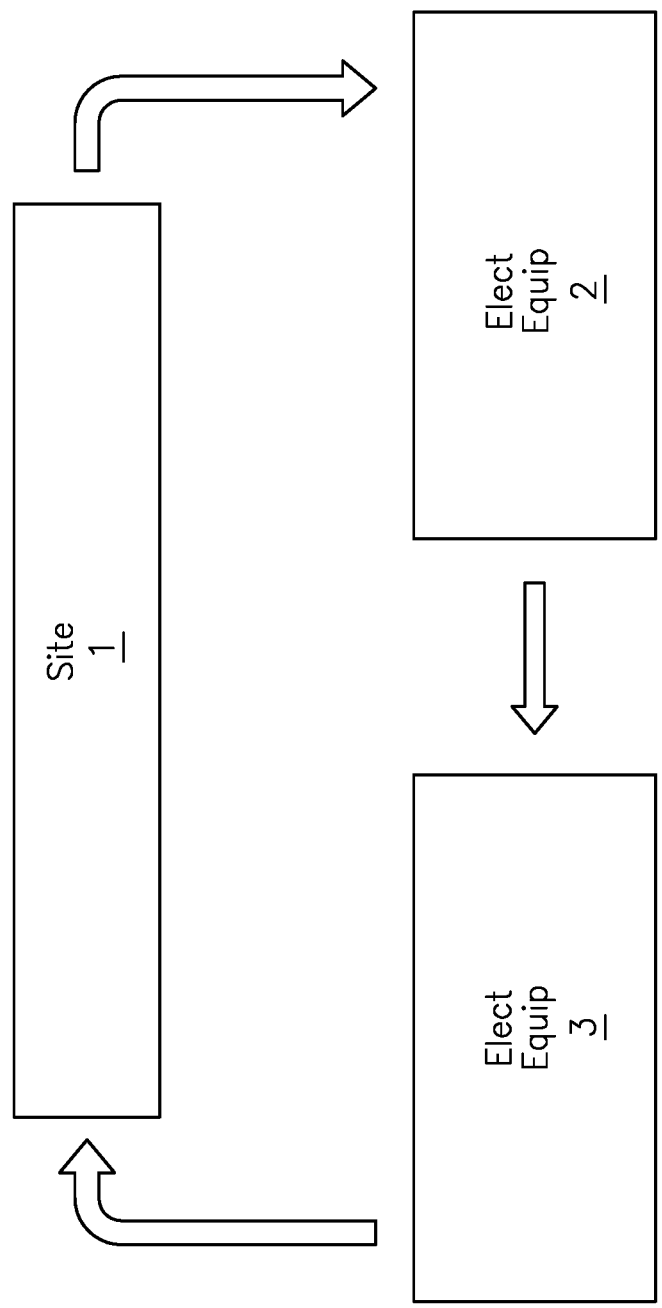
FIG. 7 depicts a view of the minimisation algorithm

The general functioning of the minimisation algorithm is described in FIG. 7. The algorithm proceeds by testing at each iteration an estimation of the signature matrix (1), calculating for said estimation of the signature matrix the temporal consumption curves (2), and calculating from said consumption curves the objective function to be minimised (3). The algorithm then updates this estimation of the signature matrix according to the values of the objective function obtained throughout the estimation.

Presentation of the Final Decomposition Algorithm

Figure 6:
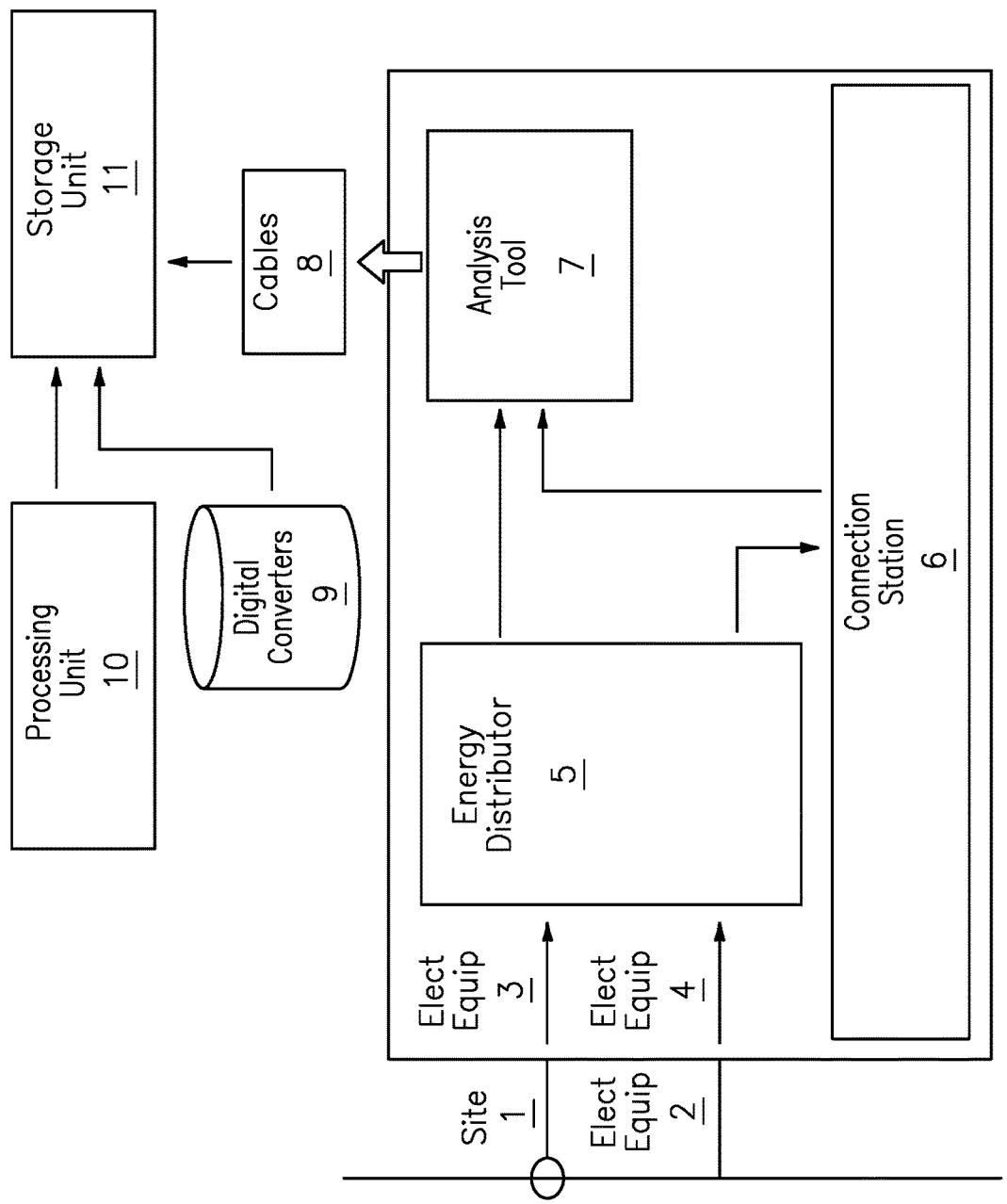
FIG. 6 depicts a schematic view of the processing operations applied to the current and voltage signals, following the signature extraction step, as far as the final step of decomposition of the global consumption into consumption according to the items of equipment present on the site

FIG. 6 depicts a schematic view of the processing operations applied to the current and voltage signals, following the signature extraction step, as far as the final step of breakdown of the global consumption into consumption according to the items of equipment present on the site.

Once again, from the measured current (1) and voltage (2) waveform signals, the FFT and temporal de-noising steps (3, 4) are performed.

In order to obtain the breakdown of the consumption of the various signatures, the signatures (6) obtained at the configuration step are not exactly used since the new signatures extracted are constant over time whereas the real signatures of the corresponding appliances exhibit variations in particular due to the voltage FFT. Because of this, the breakdown obtained by the method of the pseudo-inverse of the signature matrix may provide negative consumptions associated with certain signatures.

For this reason, for the final breakdown according to the signatures, a second optimisation step over shorter periods, around one hour (5), are proceeded with, where the fixed signatures are again calculated with respect to the voltage FFT, and the extracted signatures are enabled to be slightly disturbed with respect to their values estimated in the configuration step.

Once again, this algorithm (7) aims to minimise an objective function of the signature matrix, which depends directly on the consumptions associated with the various signatures. The objective function is the sum of four sub-functions. The first sub-function greatly penalises the negative consumption values, whereas the other three sub-functions penalise the differences between various quantities calculated with the signature matrix obtained at the configuration step on the one hand, and the disturbed signature matrix on the other hand. These quantities are the consumption curves, the temporal derivatives of the consumption curves and the signature matrix itself.

Once the breakdown of the global consumption into consumptions associated with the various signatures is available, the last phase of the method consists of making each signature correspond to an item of electrical equipment on the site and therefore to obtain the breakdown of the global consumption by items of equipment present on the site (11).

Various sources of information are used to make this association robust and precise. Firstly the signature itself is characteristic of certain types of equipment and secondly the temporal consumption curve also supplies information that is discriminating with regarding to the various types of equipment with which it may be associated. These two main items of information are compared with firstly a library of signatures of generic electrical appliances and signatures measured on site (9), and secondly information on the electrical functioning of the equipment present on the site (10), in particular their various operating modes and their nominal powers.

Variant Embodiments

The extraction of the signatures based on the observation of the variations in total consumption of an electrical network may lead to the choice of signature resulting from the combination of several unit electrical appliances with the synchronised functionings. The signature adopted therefore does not make it possible to isolate the functioning of each of the appliances concerned.

In order to afford a superior level of discrimination, complementary processing aims to attempt to break down each signature extracted on a database of known signatures in order to determine whether or not it is unitary. Each extracted signature is projected onto a base, the directions of which represent the signatures of known unitary electrical appliances by means of an optimisation algorithm, for example by minimisation of the distance between the non-unitary signature and a weighted combination of the unitary signatures. One or more performance indicators indicate the performance of this projection.

Figure 8:
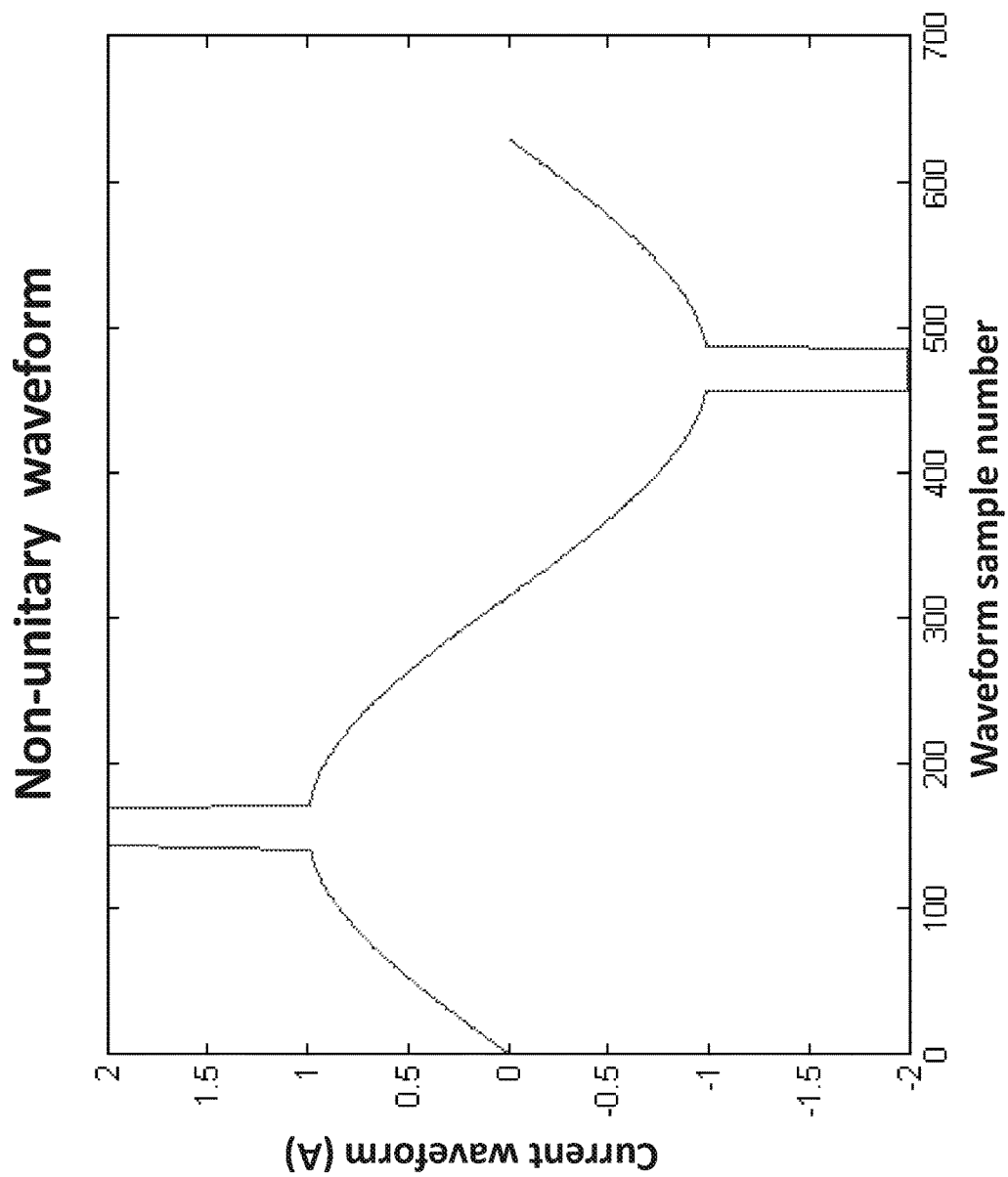
FIG. 8 presents a non-unitary waveform extracted
Figure 9:
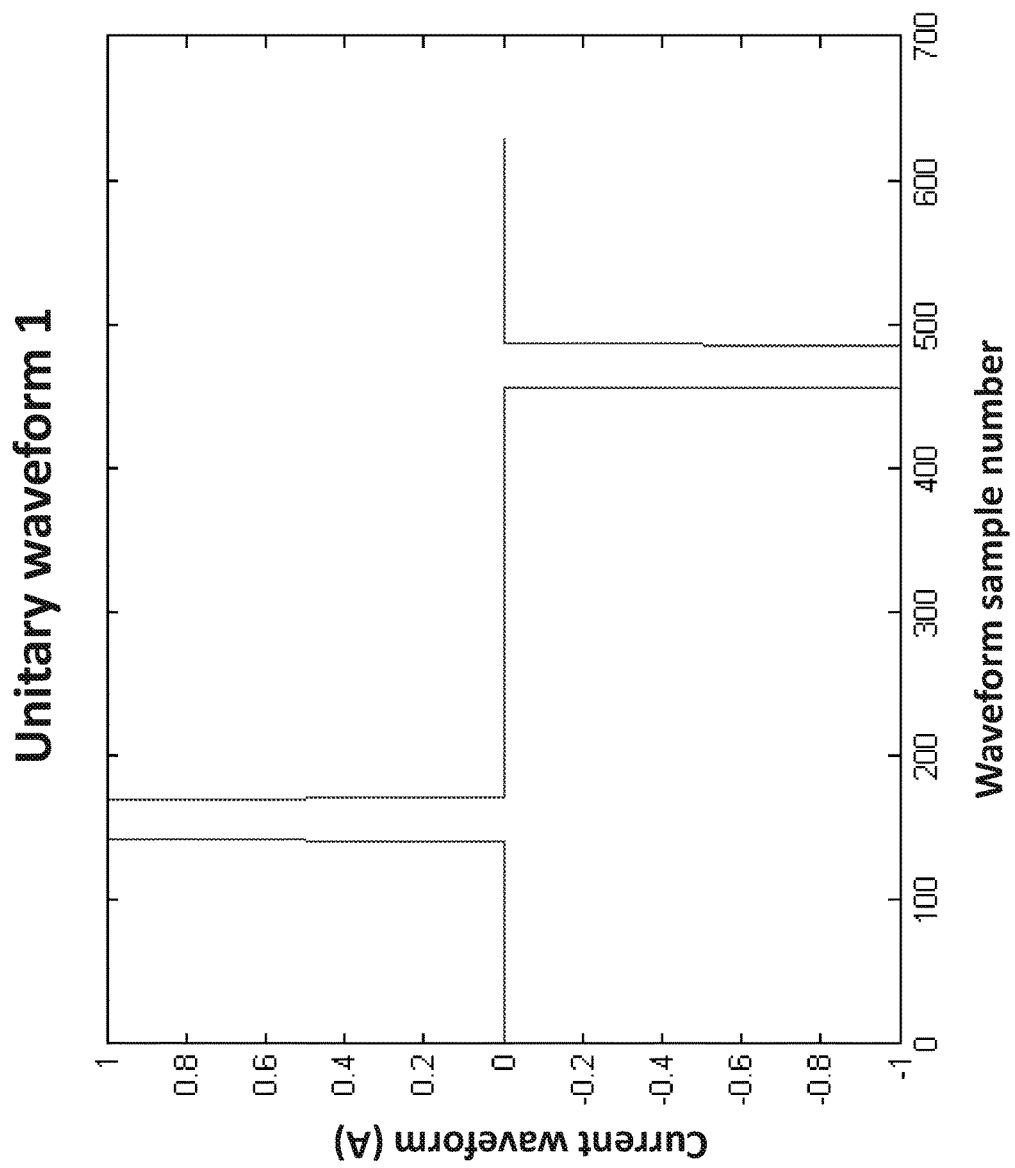
FIGS. 9 and 10 present the unitary waveforms resulting from the decomposition of the non-unitary waveform.
Figure 10:
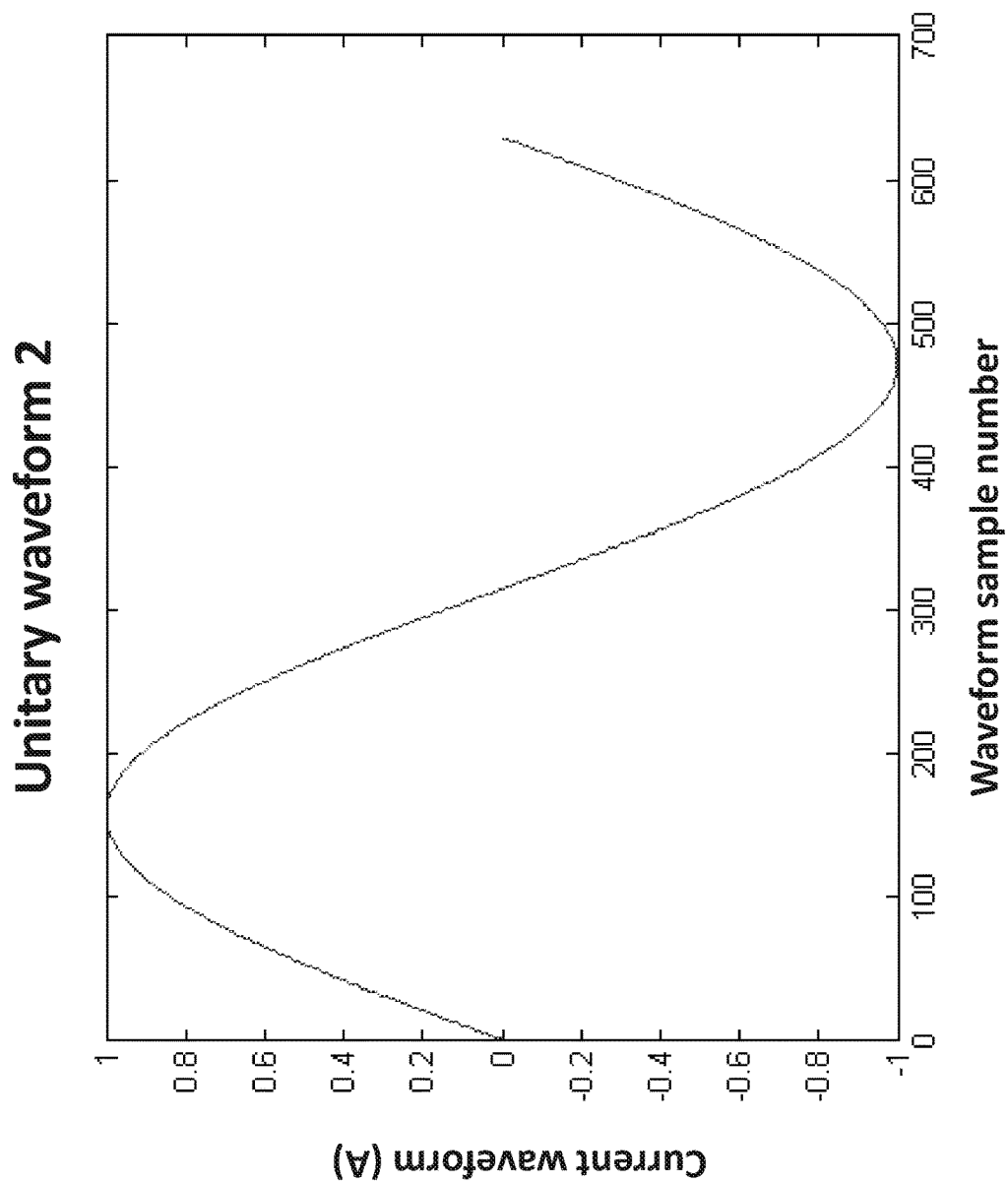

FIG. 8 presents an extracted non-unitary waveform. FIGS. 9 and 10 present the unitary waveforms resulted from the decomposition of the non-unitary waveform.

In a first embodiment, this projection is made after extraction of the signatures. If the performance indicators exceed predefined thresholds, the input signature is considered to be non-unitary and is replaced by the unitary signatures that make it up. The decomposition of the global signal is then based on the catalogue increased by these unitary signatures.

In a second embodiment, this projection is made after decomposition on the extracted signature base. If the performance indicators exceed predefined thresholds, the input signature is considered to be non-unitary and the load curve associated with this signature and resulting from the decomposition algorithm is separated according to the relative weights provided by the projection.

In order to best qualify the electrical consumption of a site, it is necessary to build a model of the overall current, depending on a set of signatures. Each signature is linked to a device in the site.

Different from the ancient technique, in which prequalified signatures are manually selected from a standard database, in this new method, signatures are variables to be estimated.

The system comprises at least one sensor for sampling the current and the voltage signals at a frequency at least thirty times greater than the fundamental frequency of the electrical supply voltage. For example, the fundamental frequency of the electrical supply voltage is 50 Hz in Europe and 60 Hz in USA and the sampling frequency must then be greater than 1.5 kHz in Europe and 1.8 kHz in the USA.

Usually, the sensor is installed upstream of the power supply network to give a global current and voltage signals of the site.

Since the voltage signal is periodic, it is possible to split the current and voltage signals as a serial of current and voltage waveforms wfi_1, wfi_2 . . . wfi_n and wfu_1, wfu_2 . . . wfu_n, where each waveform wfi_n and wfu_n have the same time duration.

Due to the sinusoidal nature of voltage signal, one can multiply each current waveform wfi_n by the amplitude a_n (in Volt) of the corresponding voltage waveform wfu_n, resulting in a new serial of waveforms WF_n=wfi_n*a_n. That way, overall mean active and reactive powers during period n can be computed straight from the new waveform WF_n since they are carried by the first complex coefficient of its Fourier transformation.

The system comprises a processor to decompose the global consumption of the site to individual consumptions of each or each kind of electrical equipment.

The waveforms WF_1, WF_2, ... WF_n computed from the global current and voltage signals are decomposed as a linear summation of the product a_ni and S_i each respectively corresponds to the power load and the normalized signature of the ith electrical equipment at the period n:

$$WF\_1 = a\_11*S\_1 + a\_12*S\_2 + a\_13*S\_3 \ldots + a\_1i*S\_i \ldots$$

$$WF\_2 = a\_21*S\_1 + a\_22*S\_2 + a\_23*S\_3 \ldots + a\_2i*S\_i \ldots$$

$$WF\_n = a\_n1*S\_1 + a\_n2*S\_2 + a\_n3*S\_3 \ldots + a\_ni*S\_i.$$

Since the electrical equipment does not change in a site, the set of signatures S_1, S_2 ... S_i does not change from one observed waveform to the other, only the power loads a_11, ..., a_ni change, which corresponds to the fact that devices are switching on or off during time or that their power loads vary continuously.

The signatures S_1, S_2 ... S_i, and power load coefficients a_11, ..., a_ni are to be computed in such a way that the difference between the measured waveforms WF_1, WF_2, ... WF_n and the calculated ones is zero or close to zero.

During initialization of the processor, the signatures S_1, S_2 ... S_i are set randomly. Then, they are optimized in the manner that the signatures as well as their corresponding power loads, comply to some reasonable constraints.

The reasonable constraints for the signatures might have the following characteristics:
dominance of the energy weight on the first harmonic,
the set of signatures may be shared for the different electrical phases.

In the frequency space, the Fourier transform of the signatures gives different order of harmonics. The first order harmonic should have a large energy weight compared to the higher order harmonics. This is called the dominance of the energy weight on the first harmonic of the signatures.

For the site equipped with electronic devices connected to several electrical phases, it is possible that for each electrical phase an independent set of signatures is used. The present invention proposes another solution to share the same set of signatures for different electrical phases, based on the assumption that, for each period n, the current waveform of the same electrical device connected to different electrical phases should have similar shape in each different electrical phase, up to a multiplicative coefficient. The real power consumption difference can therefore be presented by the variations in the power load coefficients. For example, after a device being connected to three electrical phases for a period of time, it is switched to be connected to only one phase, the same set of signatures is used for both situations; only the power load coefficients vary between the two situations.

The reasonable constraints for their corresponding power load coefficients generally has the following characteristics:
positivity,
minimization of variation.

Positivity means that the power load coefficients should be positive numbers, since there is a real power consumption of each equipment.

In general, the electrical equipment is on or off for a certain duration. Thus, the corresponding power load coefficients should be constant for a certain duration before a jump appears. This appears as a minimization of the variation in the evolution of the power load coefficient.

The most suitable set of signatures is obtained by applying the processor during two to three weeks of data acquisition. Once the most suitable set of signatures is found, each signature can be related to certain electrical equipment and is fixed for the time to go. Power consumption of each or each kind of electrical equipment is then analysed permanently.

The invention claimed is:

1. A method comprising:
setting initial signatures for electrical equipment of a site;
determining a current signal using a current sensor and a voltage signal using a voltage sensor by sampling of a supply to a site having a sampling frequency greater than about 30 times the fundamental frequency to obtain sampled current waveforms and sampled voltage waveforms over an observed period;
determining a serial of waveforms based on the sampled current waveforms and the sampled voltage waveforms;
decomposing the serial of waveforms as linear summations of a product of power load and a normalized signature, each product corresponding to a different type of electrical equipment, said normalized signature based on the initial signature and a first constraint, said first constraint comprising dominance of energy weight on a first harmonic, said power load coefficients for the site using second constraints of positivity and minimization of variation;
determining a power consumption for each kind of electrical equipment of the site based on the step of decomposing; and
forming a historical database based upon the actual power consumption of each kind of equipment corresponding to each signature and a history and providing performance indicators based on the actual power consumption of each kind of equipment.

2. The method according to claim 1, wherein the first constraint comprises sharing signatures for different electrical phases.

3. The method according to claim 1, wherein setting the initial signatures comprises randomly setting the initial signatures.

4. The method according to claim 1, wherein differences in the serial of waveforms and the linear summations are about zero or close to zero.

5. The method according to claim 1, further comprising utilizing the normalized signatures for both the step of decomposing and the step of determining the power consumption.

6. The method according to claim 1, further comprising iteratively performing the steps of
determining the current signal and the voltage signal,
determining a serial of waveforms, and
decomposing the serial of waveforms as linear summations of determining the current signal and the voltage signal,
for about two weeks to obtain a final signature for each kind of electrical equipment of the site.

7. The method according to claim 4, further comprising iteratively updating the database based on the normalized signature.

8. The method according to claim 6, wherein determining the power consumption comprises determining the power consumption of each kind of electrical equipment based on the final signature.

9. The method according to claim 6, wherein determining the power consumption comprises determining the power consumption of each kind of electrical equipment based on the final signature after the final signatures are determined.

10. The method according to claim 1, wherein in the decomposing step, known signatures from the database or signatures of equipment measured in a laboratory are used.

11. A method comprising:
   setting initial signatures for electrical equipment of a site;
   determining a current signal using a current sensor and a voltage signal using a voltage sensor by sampling of a supply to a site having a sampling frequency greater than about 30 times the fundamental frequency to obtain sampled current waveforms and sampled voltage waveforms over an observed period;
   determining a serial of waveforms based on the sampled current waveforms and the sampled voltage waveforms;
   decomposing the serial of waveforms as linear summations of a product of power load and a normalized signature, each product corresponding to a different type of electrical equipment, said normalized signature based on the initial signature and a first constraint, said first constraint comprising dominance of energy weight on a first harmonic, said power load coefficients for the site using second constraints of positivity and minimization of variation;
   determining a power consumption for each kind of electrical equipment of the site;
   iteratively forming until differences in the serial of waveforms and the linear summations are about zero or close to zero, said database based upon the actual power consumption of each kind of equipment corresponding to each signature and a history; and
   providing performance indicators based on the actual power consumption of each kind of equipment.

* * * * *